(12) United States Patent
Ichihara

(10) Patent No.: US 6,518,846 B2
(45) Date of Patent: Feb. 11, 2003

(54) VOLTAGE CONTROLLED OSCILLATOR WITH VOLTAGE REGULATION

(75) Inventor: Yukio Ichihara, Hyogo (JP)

(73) Assignees: Mitsubishi Denki Kabushiki Kaisha, Tokyo (JP); Mitsubishi Electric System LSI Design Corporation, Itami (JP)

( * ) Notice: Subject to any disclaimer, the term of this patent is extended or adjusted under 35 U.S.C. 154(b) by 0 days.

(21) Appl. No.: 09/755,120

(22) Filed: Jan. 8, 2001

(65) Prior Publication Data

US 2002/0000886 A1 Jan. 3, 2002

(30) Foreign Application Priority Data

Jul. 3, 2000 (JP) ........................................ 2000-201381

(51) Int. Cl.[7] ................................................. H03L 7/00
(52) U.S. Cl. ........................ 331/57; 331/175; 331/182; 331/185
(58) Field of Search ........................ 331/57, 182, 185, 331/175

(56) References Cited

U.S. PATENT DOCUMENTS 5,686,867 A * 11/1997 Sutardja et al. ............... 331/57
5,959,502 A * 9/1999 Ovens et al. ................... 331/8

FOREIGN PATENT DOCUMENTS

| JP | 55-31348 | 2/1980 |
| JP | 2-58932 | 2/1990 |

* cited by examiner

Primary Examiner—Arnold Kinkead
(74) Attorney, Agent, or Firm—Burns, Doane, Swecker & Mathis, LLP

(57) ABSTRACT

In a voltage controlled oscillator (VCO) having a voltage-current conversion circuit, a ring oscillator, and a main power supply for feeding a power supply voltage to these components, it is constructed so that a voltage which is fed to the voltage-current conversion circuit and ring oscillator may be applied with an internal voltage via a regulator circuit, thus effecting an oscillation output having only slight variations to the variations of the power supply voltage. Therefore, a phase synchronous circuit such as PLL circuits may be maintained at a locked status. In some instances, such a VCO may be modified not only to stabilize the dynamic range to the VCO control voltage, but also to switch the dynamic range. Thus, the oscillation frequency oscillated and outputted by the ring oscillator may be stabilized even upon the occurrences of the variations of the power supply voltage Vcc which is fed at a locked status.

1 Claim, 2 Drawing Sheets

VOLTAGE CONTROLLED OSCILLATOR WITH VOLTAGE REGULATION

BACKGROUND OF THE INVENTION

1. Field of the Invention

The present invention relates to a voltage controlled oscillator that constructs a phase synchronous circuit for use in the OSD display control for television screens and the like, and more specifically, to a voltage controlled oscillator that controls the variations of an oscillation frequency to the variations of a power supply.

2. Description of Related Art

FIG. 4 is a block circuit diagram showing a conventional voltage controlled oscillator (hereinafter, abbreviated to as VCO) that constitutes a phase synchronous circuit for use in the OSD display control. In FIG. 4, reference numeral 101 designates a voltage-current conversion circuit; 102 designates a ring oscillator; 103 designates a main power supply for feeding a power supply voltage Vcc to these voltage-current conversion circuit 101 and ring oscillator 102; Vc denotes a VCO control voltage for controlling the voltage controlled oscillator; Vout denotes an oscillation output from the voltage controlled oscillator; and 110 designates ground. Note that a control signal generated by the voltage-current conversion circuit 101 is designated by Vic.

The operation will be next described below.

The VCO control voltage Vc is inputted to the voltage-current conversion circuit 101, which converts the power supply voltage Vcc to generate the control signal Vic. The ring oscillator 102 is controlled by the control signal Vic to generate the oscillation output Vout. In other words, these construct a voltage controlled oscillator in which the oscillation output Vout is controlled by the VCO control voltage Vc. In addition, the oscillation output Vout becomes a signal to generate the VCO control voltage Vc, and also serves as one type of loop circuit.

Since the conventional voltage controlled oscillator is configured as described above, the oscillation output Vout is varied or is not put in a locked status due to the variations of the power supply voltage Vcc even when the VCO control voltage is constant in the phase synchronous circuit such as PLL circuits having such a voltage controlled oscillator. Thus, when it is employed for the OSD display control, there are some problems such that swinging literatures and jitters occur on the display.

SUMMARY OF THE INVENTION

The present invention is implemented to solve the foregoing drawbacks. It is therefor an object of the present invention to provide a voltage controlled oscillator capable of maintaining the locked status with controlling the variations of the oscillation output to that of the power supply voltage.

According to a first aspect of the present invention, there is provided a voltage controlled oscillator comprising: a main power supply for feeding a power supply voltage; a regulator circuit for, in response to the power supply voltage, generating an internal voltage with controlling the variations of the power supply voltage; a voltage-current conversion circuit for generating a control signal based on an internal voltage fed from the regulator circuit by inputting a control voltage from the external; and a ring oscillator for generating an oscillation output based on the internal voltage fed from the regulator circuit by inputting the control signal.

According to a second aspect of the present invention, there is provided a voltage controlled oscillator comprising: a main power supply for feeding a power supply voltage; a regulator circuit for, in response to the power supply voltage, generating an internal voltage with controlling the variations of the power supply voltage; a voltage-current conversion circuit for generating a control signal based on the power supply voltage fed from the the main power supply by inputting a control voltage from the external; and a ring oscillator for generating an oscillation output based on the internal voltage fed from the regulator circuit by inputting the control signal.

Here, the voltage controlled oscillator may further comprise: a switch arranged between the regulator circuit and the voltage-current conversion circuit to be capable of connecting the main power supply with the voltage-current conversion circuit, while bypassing the regulator circuit, thereby selecting and feeding either the internal voltage from the regulator circuit or the power supply voltage from the main power supply.

DETAILED DESCRIPTION OF THE PREFERRED EMBODIMENTS

An embodiment of the present invention will be described below.

Embodiment 1

Figure 1:
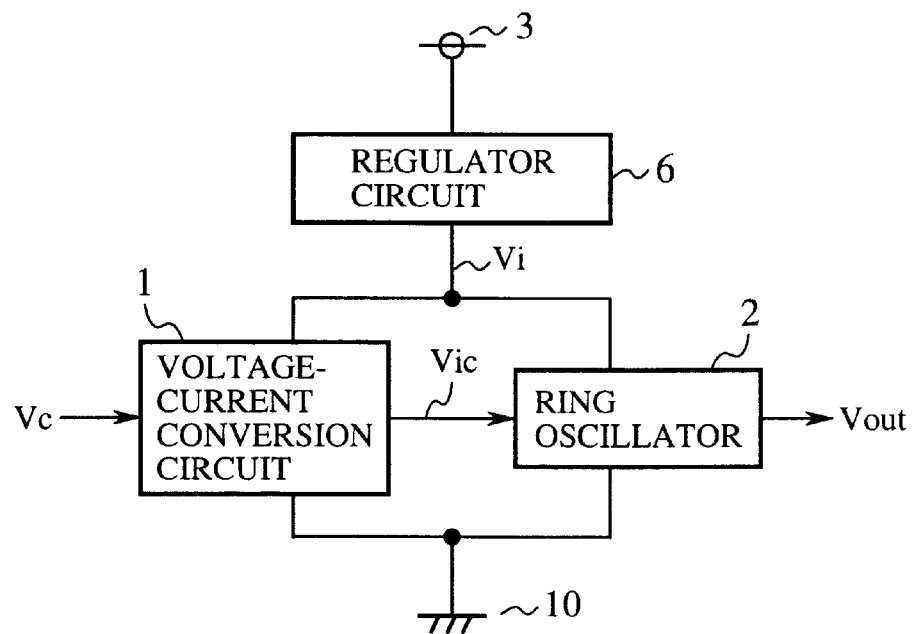
FIG. 1 is a block circuit diagram showing a voltage controlled oscillator in accordance with to an embodiment 1 of the present invention.

FIG. 1 is a block circuit diagram showing a voltage controlled oscillator (VCO) in accordance with to an embodiment 1 of the present invention. In FIG. 1, reference numeral 1 designates a voltage-current conversion circuit; 2 designates a ring oscillator; 6 designates a regulator circuit for feeding an internal voltage Vi to these voltage-current conversion circuit 1 and ring oscillator 2; 3 designates a main power supply for feeding a power supply voltage Vcc to the regulator circuit 6; Vc denotes a VCO control voltage (control voltage) for controlling the voltage controlled oscillator; Vi denotes an internal voltage; Vout denotes an oscillation output from the VCO; and 10 designates ground.

The operation will be next described below.

The internal voltage Vi generated by the regulator circuit 6 is fed to the voltage-current conversion circuit 1 and ring oscillator 2. The VCO control voltage Vc is inputted from the external to the voltage-current conversion circuit 1, which generates a control signal Vic based on the internal voltage Vi. The ring oscillator 2 is controlled based on the control signal Vic generated by the voltage-current conversion circuit 1, and the oscillation output Vout is generated based on the internal voltage Vi as well. In other words, these components construct the voltage controlled oscillator in which the oscillation output Vout is controlled based on the VCO control voltage Vc. Note that the oscillation output Vout becomes a signal to generate the VCO control voltage Vc, and serves as one type of loop circuit.

In the aforementioned voltage controlled oscillator VCO, there occurs slight voltage variations on the regulator circuit 6 even when the power supply voltage Vcc is varied. For this reason, when the VCO control voltage Vc is constant, the oscillation output Vout is stabilized, thereby maintaining a locked status of the phase synchronous circuit connecting with the voltage controlled oscillator.

As described above, according to the embodiment 1, it is constructed that the power supply voltage Vcc from the main power supply 3 is brought to a circuit operation in the voltage-current conversion circuit 1 and ring oscillator 2 with the internal voltage Vi generated by the regulator circuit 6. In such a way, even when the power supply voltage Vcc is varied, there are no variations in the voltage fed to the voltage-current conversion circuit 1 and ring oscillator 2. As a result, the oscillation output Vout may achieve a stabilized oscillation frequency. That is, the oscillation output Vout having slight variations to that of the power supply voltage Vcc is obtained through the voltage controlled oscillator, and thereby the phase synchronous circuit connected to this may be maintained its locked status more stably.

Embodiment 2

Figure 2:
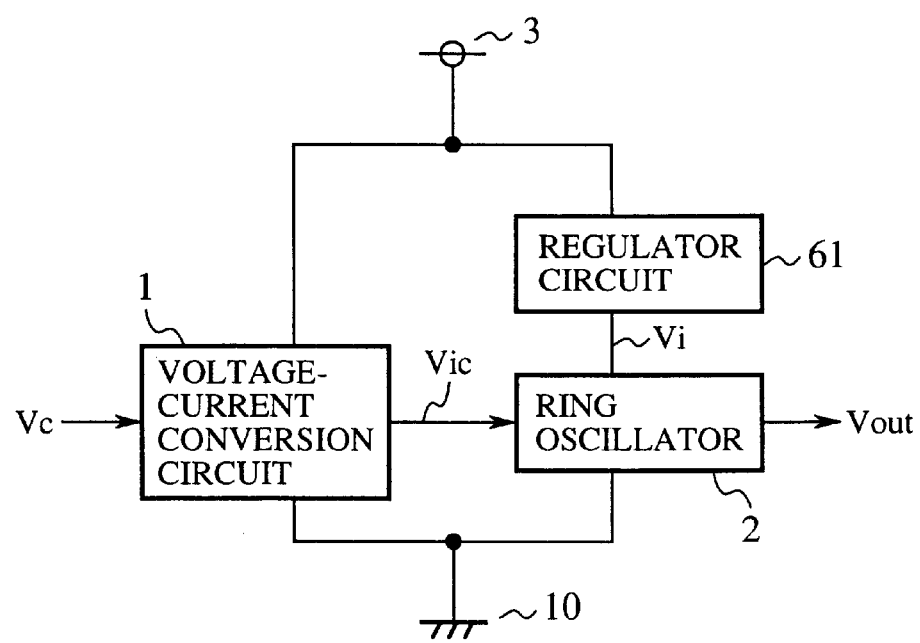
FIG. 2 is a block circuit diagram showing a voltage controlled oscillator in accordance with to an embodiment 2 of the present invention.

FIG. 2 is a block circuit diagram showing a voltage controlled oscillator in accordance with to an embodiment 2 of the present invention. In FIG. 2, reference numeral 1 designates a voltage-current conversion circuit; 2 designates a ring oscillator; 61 designates a regulator circuit for feeding an internal voltage Vi to the ring oscillator 2; 3 designates a main power supply for feeding a power supply voltage Vcc to the regulator circuit 61; Vc denotes a VCO control voltage for controlling the voltage controlled oscillator; Vi denotes an internal voltage; Vout denotes an oscillation output from the VCO; and 10 designates ground.

The operation will be next described below.

The power supply voltage Vcc from the main power supply 3 is fed to the voltage-current conversion circuit 1. The internal voltage Vi generated by the regulator circuit 61 is fed to the ring oscillator 2. The VCO control voltage Vc is inputted externally or from the external to the voltage-current conversion circuit 1, while the ring oscillator 2 is controlled based on the control signal Vic generated by the voltage-current conversion circuit 1, thus generating the oscillation output Vout based on the internal voltage Vi. In other words, these components constructs a voltage controlled oscillator in which the oscillation output Vout is controlled based on the VCO control voltage Vc. Note that the oscillation output Vout becomes a signal to generate the VCO control voltage Vc and serves as one type of loop circuit.

In the aforementioned voltage controlled oscillator VCO, there occur a few voltage variations on the regulator circuit 6 even when the power supply voltage Vcc is varied. For this reason, when the VCO control voltage Vc is constant, the oscillation output Vout is stabilized, thereby maintaining a locked status of the phase synchronous circuit connecting with the voltage controlled oscillator.

In addition, since the power supply voltage Vcc is fed to the voltage-current conversion circuit 1, there is no change of the dynamic range to the VCO control voltage Vc.

As described above, according to the embodiment 2, it is constructed that the power supply voltage Vcc from the main power supply 3 is fed to the voltage-current conversion circuit 1, while the internal voltage Vi having a few voltage variations is fed to the ring oscillator 2 through the regulator circuit 61. In such a way, the oscillation output Vout to be generated comes to have a stabilized oscillation frequency, and even when the power supply voltage Vcc is varied, the voltage controlled oscillator can output the stabilized oscillation output Vout, thereby maintaining a locked status of the phase synchronous circuit.

In addition, since the power supply voltage Vcc is provided directly to the voltage-current conversion circuit 1, the dynamic range to the VCO control voltage Vc is not changed.

Embodiment 3

Figure 3:
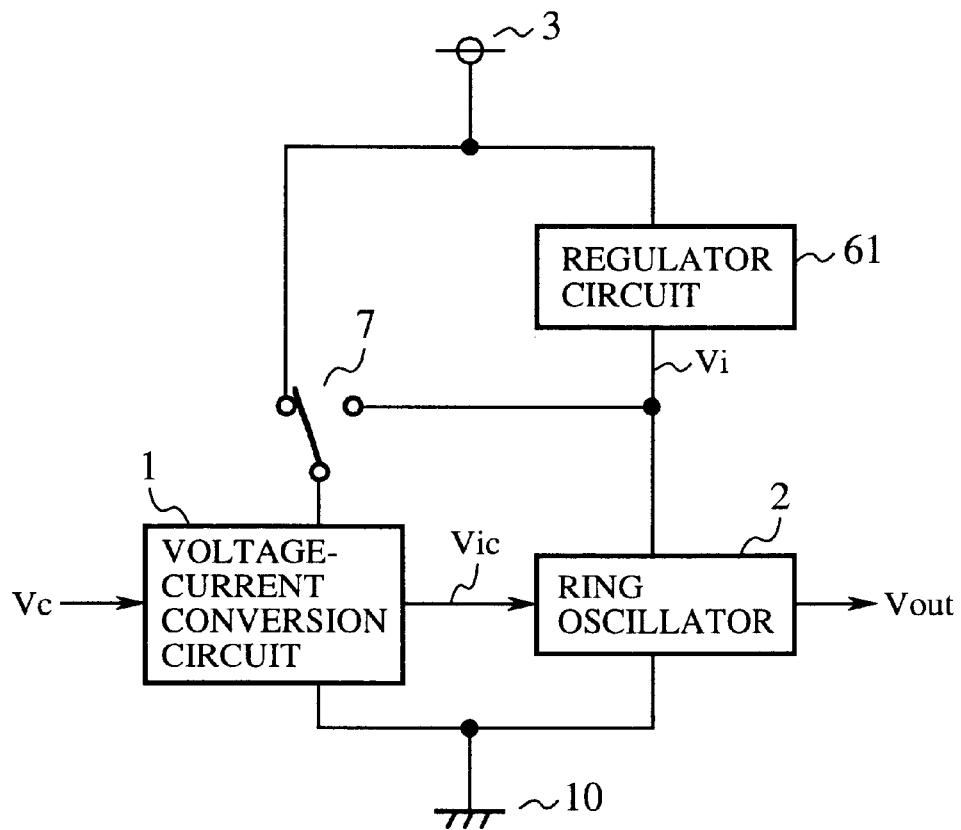
FIG. 3 is a block circuit diagram showing a voltage controlled oscillator in accordance with to an embodiment 3 of the present invention.
Figure 4:
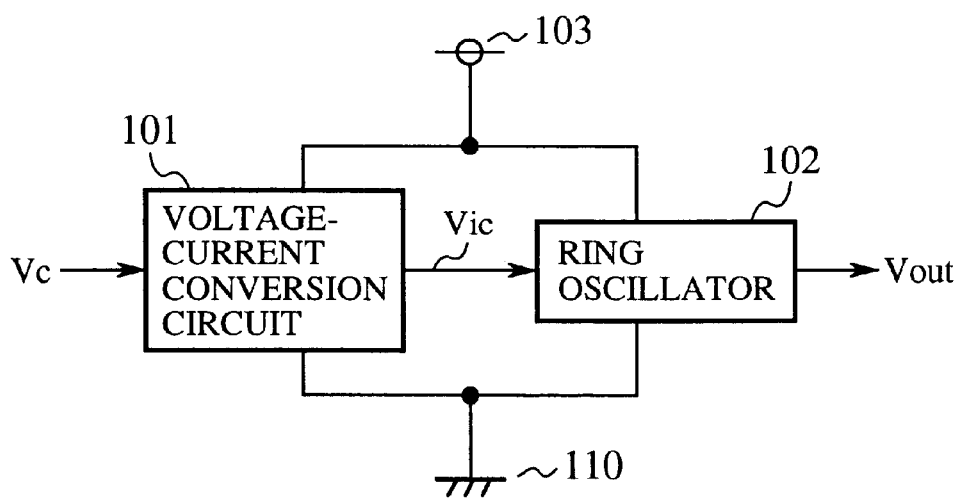
FIG. 4 is a block circuit diagram showing a conventional voltage controlled oscillator.

FIG. 3 is a block circuit diagram showing a voltage controlled oscillator in accordance with to an embodiment 3 of the present invention. In FIG. 2, reference numeral 1 designates a voltage-current conversion circuit; 2 designates a ring oscillator; 61 designates a regulator circuit for feeding an internal voltage Vi to the ring oscillator 2 and a switch 7; 3 designates a main power supply for feeding power supply voltage Vcc to the regulator circuit 61; 7 designates a switch 7 for switching the voltage to be fed to the voltage-current conversion circuit 1 in response to the internal voltage Vi generated in the regulator circuit 61 and the power supply voltage Vcc from the main power supply 3; Vc denotes a VCO control voltage; Vout denotes an oscillation output; and 10 designates ground.

The operation will be next described below.

The internal voltage Vi generated from the regulator circuit 61 or the power supply voltage Vcc from the main power supply 3 is fed to the voltage-current conversion circuit 1 by way of the switch 7, while the internal voltage Vi generated from the regulator circuit 61 is fed to the ring oscillator 2. The VCO control voltage Vc is inputted from the external to the voltage-current conversion circuit 1, and the ring oscillator 2 is controlled based on a control signal Vic generated from the voltage-current conversion circuit 1, thus generating the oscillation output Vout based on the internal voltage Vi. In other words, these components constructs a voltage controlled oscillator in which the oscillation output Vout is controlled based on the VCO control voltage Vc. Note that the oscillation output Vout becomes a signal to generate the VCO control voltage Vc, and serves as one type of loop circuit.

In the aforementioned voltage controlled oscillator VCO, there occur a few voltage variations on the regulator circuit 6 even when the power supply voltage Vcc is varied. For this reason, when the VCO control voltage Vc is constant, the oscillation output Vout is stabilized, thereby maintaining a locked status of the phase synchronous circuit connecting with the voltage controlled oscillator.

In addition, the voltage-current conversion circuit 1 enables to switch the dynamic range to the VCO control voltage Vc by switching the internal voltage Vi generated from the regulator 61 and the power supply voltage Vcc from the main power supply 3 via the switch 7.

As described above, according to the embodiment 3, based on the voltage fed to the voltage-current conversion circuit 1, switching between the power supply voltage Vcc from the main power supply 3 and the internal voltage Vi from the regulator 61 is enabled, and based on the circuit 1, the control signal Vic is generated, while the internal voltage Vi generated from the regulator circuit 61 is fed to the ring oscillator, thus generating the oscillation output Vout in response to the input of the control signal Vic. In such a way, since the regulator circuit 61 which is hard to be affected by the variations of the power supply voltage Vcc is used mainly, the stabilized oscillation output Vout may be achieved and switching of the. dynamic range of the voltage controlled circuit is also enabled. Therefore, the oscillation output Vout having a few variations to the variations of the power supply voltage Vcc may be obtained and thereby the locked status of the phase synchronous circuit may be maintained stably.

Further, in such a way, the dynamic range to the VCO control voltage Vc is changeable.

What is claimed is:

1. A voltage controlled oscillator comprising:

a main power supply for feeding a power supply voltage;

a regulator circuit for, in response to the power supply voltage, generating an internal voltage controlling the variations of the power supply voltage;

a voltage-current conversion circuit for generating a control signal based on an internal voltage fed from said regulator circuit by inputting a control voltage from external;

a ring oscillator for generating an oscillation output based on the internal voltage fed from said regulator circuit by inputting said control signal; and a switch arranged between said regulator circuit and said voltage-current conversion circuit to be capable of connecting said main power supply with said voltage-current conversion circuit, while bypassing the regulator circuit, thereby selecting and feeding either the internal voltage from said regulator circuit or the power supply voltage from said main power supply.

* * * * *